United States Patent
Kueng et al.

(10) Patent No.: US 6,411,145 B1
(45) Date of Patent: Jun. 25, 2002

(54) FEEDBACK CONTROL OF CLOCK DUTY CYCLE

(75) Inventors: Jeff S. Kueng, New Brighton; Justin J. Kraus, Chaska, both of MN (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/881,365

(22) Filed: Jun. 14, 2001

(51) Int. Cl.$^7$ ................................................ H03K 7/08
(52) U.S. Cl. ................ 327/175; 327/172; 327/173; 327/174; 327/52; 330/267; 330/268
(58) Field of Search ........................... 327/31, 35, 36, 327/51, 52, 172, 173, 174, 175; 330/263–265, 267, 268

(56) References Cited

U.S. PATENT DOCUMENTS

| | | | |
|---|---|---|---|
| 4,797,586 A | * | 1/1989 | Traa .......................... 327/276 |
| 4,801,827 A | * | 1/1989 | Metz .......................... 327/280 |
| 4,862,020 A | * | 8/1989 | Cowan et al. ............... 327/172 |
| 5,291,073 A | * | 3/1994 | Lewandowski ............. 327/512 |
| 5,448,196 A | * | 9/1995 | Kanbara et al. ............ 327/231 |
| 5,608,352 A | * | 3/1997 | Itakura ........................ 330/253 |
| 6,208,199 B1 | * | 3/2001 | Andersson ................... 327/561 |

* cited by examiner

Primary Examiner—Timothy P. Callahan
Assistant Examiner—An T. Luu
(74) Attorney, Agent, or Firm—Trexler, Bushnell, Giangiorgi, Blackstone & Marr Ltd.

(57) ABSTRACT

A circuit configured to correct a duty cycle error or vary the duty cycle of a clock signal. The circuit includes a differential amplifier or control circuit that receives differential signal inputs. At least one differential pair of transistors is connected to outputs of the differential amplifier or control circuit. Outputs of the one or more differential pairs of transistors are connected to inputs of a differential circuit. The differential amplifier or control circuit is connected to the outputs of the differential circuit. The one or more differential pairs of transistors is configured to change a DC level of at least one of the inputs of the differential circuit in order to shift a cross over point of the inputs of the differential circuit and thereby effect a duty cycle change (or correction) at the outputs of the differential circuit.

23 Claims, 3 Drawing Sheets

FEEDBACK CONTROL OF CLOCK DUTY CYCLE

BACKGROUND

This invention generally relates to clock recovery circuits, and more specifically relates to a circuit which provides continuous correction/adjustment of the duty cycle of a clock signal.

In clock recovery applications, such as in serial data communications, the data which is received contains clock alignment information. Clock recovery circuits enable the capture of the recovered data by using this information to align a clock to the received data. The duty cycle of this aligned clock can be critical to the error margin of the data capture.

Often times, a clock signal has a duty cycle which is distorted due to semiconductor process error. Often in high speed integrated circuits, the duty cycle of a CML clock signal can be critical to performance. The duty cycle of a clock can either determine critical timing margins or be used to adjust timing, depending on the application. In one application, a clock recovery circuit generates a clock whose falling edges are aligned to the transitions in the received data signal. When these edges are aligned, a perfect duty cycle would have a rising edge which is perfectly centered on a data bit. Any movement to either side of this perfect alignment, caused by an imperfect duty cycle, affects the robustness of the data capture ability. FIG. 1 illustrates a received clock signal 10 and an aligned clock signal 12, wherein the aligned clock signal 12 has a perfect duty cycle, while FIG. 2 illustrates a received clock signal 14 and an aligned clock signal 16, wherein the aligned clock signal 16 has a degraded duty cycle.

Because the duty cycle of a clock signal can be so critical to performance, it is important to recover a clock signal which has no duty cycle distortion.

Data capture circuits do not provide for the continuous analog correction of duty cycle. Instead, many current data capture circuit designs build in a margin to allow for duty cycle distortion. However, allowing for duty cycle distortion reduces the robustness of the design.

OBJECTS AND SUMMARY

A general object of an embodiment of the present invention is to provide a circuit which is configured to correct or adjust the duty cycle of a clock signal.

Another object of an embodiment of the present invention is to provide a circuit which is to configured to continuously and automatically correct the duty cycle of a clock signal without employing a built in margin which allows for duty cycle distortion.

Still another object of an embodiment of the present invention is to provide a circuit that includes a differential pair of transistors that is configured to pull at least one of the inputs of a differential circuit down in order to shift a cross over point of the inputs of the differential circuit and thereby effect a duty cycle change (or correction) at the outputs of the differential circuit.

Briefly, and in accordance with at least one of the foregoing objects, an embodiment of the present invention provides a circuit that is configured to correct a duty cycle error or vary the duty cycle of a clock signal. The circuit includes a differential amplifier or control circuit that receives differential signal inputs. At least one differential pair of transistors is connected to outputs of the differential amplifier or control circuit. Outputs of the one or more differential pairs of transistors are connected to inputs of a differential circuit. The differential amplifier or control circuit is connected to the outputs of the differential circuit. The one or more differential pairs of transistors is configured to pull at least one of the inputs of the differential circuit down in order to shift a cross over point of the inputs of the differential circuit and thereby effect a duty cycle change (or correction) at the outputs of the differential circuit.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DESCRIPTION

Figure 1:
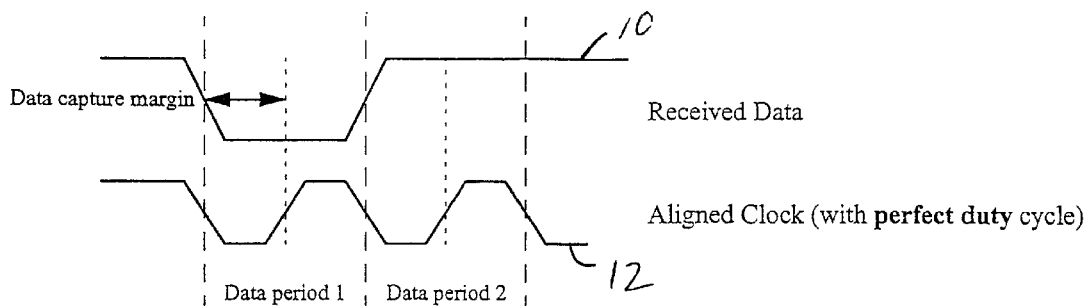
FIG. 1 is a pulse diagram showing received data and aligned clock signals, wherein the duty cycle is perfect.
Figure 2:
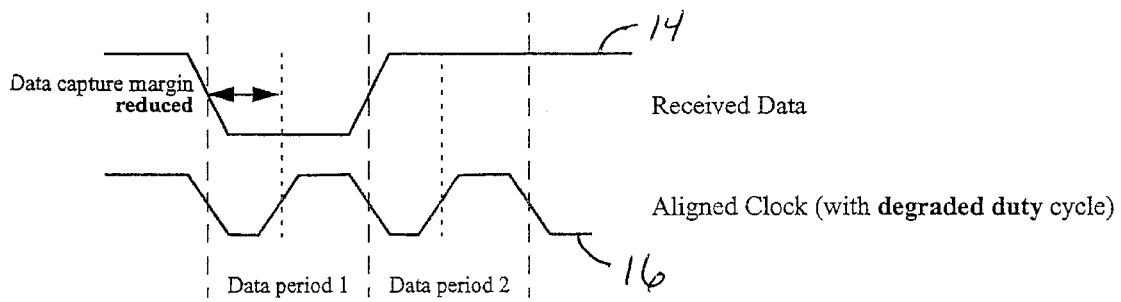
FIG. 2 is a pulse diagram similar to FIG. 1, but showing the case where the duty cycle is degraded.

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

Figure 3:
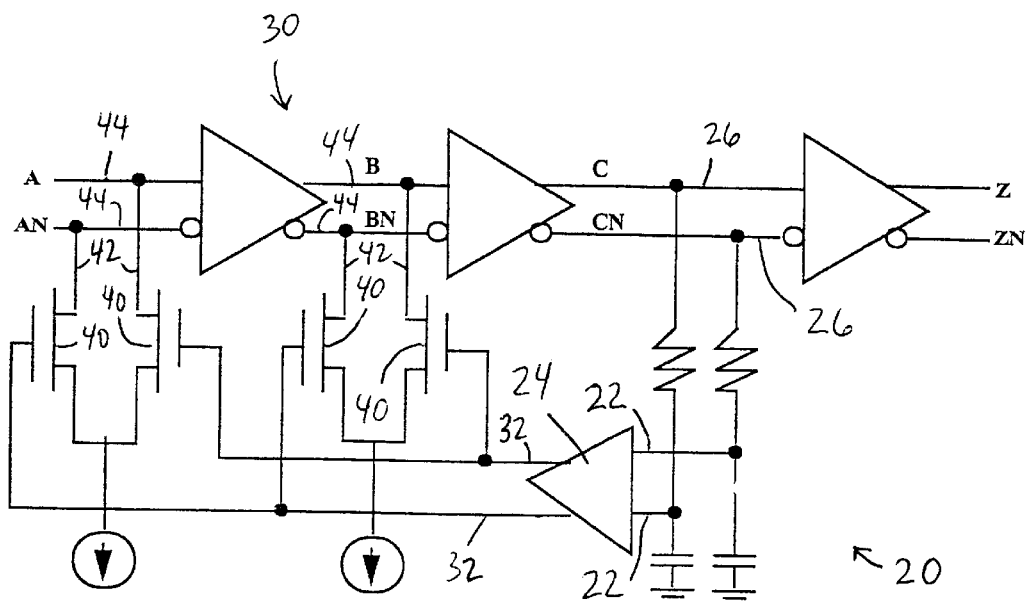
FIG. 3 illustrates a circuit which is in accordance with an embodiment of the present invention, wherein the duty cycle is restored for signal integrity.
Figure 4:
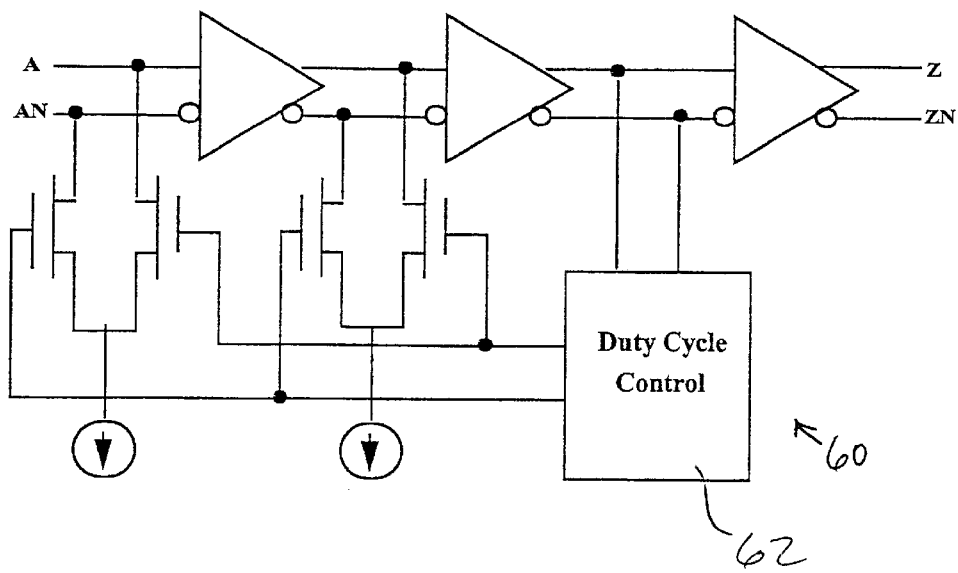
FIG. 4 illustrates a circuit which is in accordance with another embodiment of the present invention, wherein the duty cycle is distorted for delay variation.

FIG. 3 illustrates a circuit 20 which is in accordance with one embodiment of the present invention. The circuit 20 is configured to correct or restore the duty cycle of a clock signal for signal integrity. FIG. 4 illustrates a similar circuit 60 which is in accordance with another embodiment of the present invention. The circuit is configured to distort the duty cycle of a clock signal for delay variation. Both circuits 20, 60 are configured to adjust the duty cycle of a clock signal, either continuously and automatically for duty cycle correction (FIG. 3) or selectively in order to accomplish a desired phase change (FIG. 4). Because the circuits 20, 60 shown in FIGS. 3 and 4 are so similar, the circuit 20 illustrated in FIG. 3 is initially described, and then the differences between the circuits are discussed.

Figure 5:
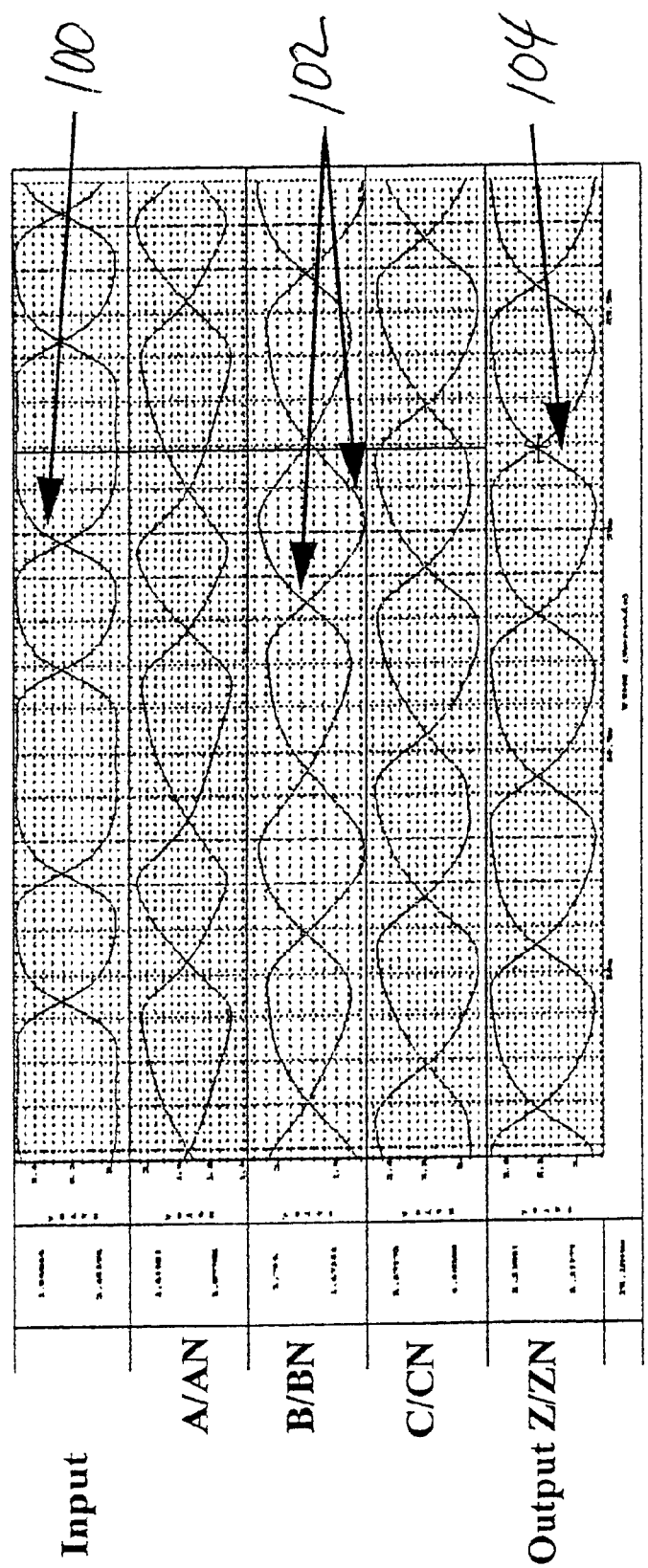
FIG. 5 shows the signals of the circuits illustrated in FIGS. 3 and 4.

The circuit 20 shown in FIG. 3 automatically and continuously corrects the duty cycle of a clock signal back to 50% for the most optimal capture. This correction is realized by creating a DC shift in one out of the differential pair of clock signals. FIG. 5 illustrates each of the signals identified in FIG. 3, namely "Input", "A/An", "B/BN", "C/CN"and "output Z/ZN". This shift in one signal out of the pair causes the zero crossings of the circuit to change. These crossings dictate the duty cycle seen by the following differential stage as the zero crossings move earlier or later in time along the rising or falling edges of the signals. This is shown in FIG. 5, wherein the signal "Input" is an input with a 40% duty cycle (100), there is a shift down to change crossover occurrence on B/BN (102), and the output Z/ZN has a restored 50% duty cycle (104).

The circuit shown in FIG. 3 provides that a clock with duty cycle distortion as large as 10% can be recovered to within 1.5% of perfect duty cycle. As shown in FIG. 3, the inputs 22 of a differential amplifier 24 are connected to leads 26 of a differential circuit 30. The circuit 20 accomplishes the duty cycle correction using a DC integration of two differential signals received at the inputs 22 of the differential amplifier 24.

Outputs 32 of the differential amplifier 24 are connected to, and drive, differential pairs of transistors 40. Drains 42 of the differential pairs of transistors 40 are connected to inputs 44 of the differential circuit 30 whose outputs 26 are used to create the error signal. The differential pairs of transistors 40 pull the appropriate signal down in order to shift the cross over point of the input 44 and thus accomplish a duty cycle change on the output 26. This duty cycle change on the output 26 reduces the error signal applied to the differential pairs of transistors 40.

While FIGS. 3 (and 4) show two differential pairs of transistors 40, more than two or fewer than two pairs can be employed to produce the desired result. For example, multiple differential stages can be used, wherein each differential stage has its own set of correction differential pair of transistors effectively feeding off the error signal of the last stage. Each stage's correction circuit can then have a different amount of gain.

The circuit shown in FIG. 3 automatically and continuously corrects the duty cycle of the clock signal. This is important for signal integrity, and is important because, often in high speed integrated circuits, the duty cycle of a clock signal can be critical to performance and determines critical timing margins.

The circuit 60 shown in FIG. 4 is very similar to that which is shown in FIG. 3, the only difference being that instead of employing a differential amplifier, the circuit includes a duty cycle control circuit 62. The duty cycle control circuit 62 is configured to adjust the duty cycle of the clock signal to accomplish a desired phase change for clock adjustment. The circuit 60 provides that distortion can be selectively induced in the duty cycle, in continuous or discreet quantities, in order to adjust phase or delay, such as is regularly accomplished in interpolators or clock mixers.

While embodiments of the present invention are shown and described, it is envisioned that those skilled in the art may devise various modifications of the present invention without departing from the spirit and scope of the appended claims.

What is claimed is:

1. A circuit configured to correct a duty cycle error of a clock signal, said circuit comprising: a pair of inputs configured to receive differential signals, wherein a difference between said differential signals generally indicates the duty cycle error of the clock signal; a differential amplifier connected to said inputs, said differential amplifier having outputs; a differential pair of transistors connected to said outputs of said differential amplifier, said differential pair of transistors configured to shift a cross over point of the signals carried at the outputs of said differential amplifier, further comprising a plurality of differential pairs of transistors connected to said outputs of said differential amplifier.

2. A circuit its recited in claim 1, wherein said differential signals received at the pair of inputs comprises DC signals.

3. A circuit configured to correct a duty cycle error of a clock signal, said circuit comprising: a pair of inputs configured to receive differential signals, wherein a difference between said differential signals generally indicates the duty cycle error of the clock signal; a differential amplifier connected to said inputs, said differential amplifier having outputs; a differential pair of transistors connected to said outputs of said differential amplifier, said differential pair of transistors configured to shift a cross over point of the signals carried at the outputs of said differential amplifier, wherein said circuit includes a differential circuit having inputs and outputs, wherein outputs of said differential pair of transistors are connected to inputs of said differential circuit, and said differential amplifier is connected to the outputs of said differential circuit.

4. A circuit as recited in claim 3, wherein said differential pair of transistors is configured to pull at least one of the inputs of said differential circuit down in order to shift a cross over point of the inputs of the differential circuit and thereby effect a duty cycle change at the outputs of the differential circuit.

5. A circuit as recited in claim 4, wherein said differential signals received at the pair of inputs comprises DC signals.

6. A circuit as recited in claim 3, wherein said differential signals received at the pair of inputs comprises DC signals.

7. A circuit configured to correct a duty cycle error of a clock signal, said circuit comprising: a pair of inputs configured to receive differential signals, wherein a difference between said differential signals generally indicates the duty cycle error of the clock signal; a differential amplifier connected to said inputs, said differential amplifier having outputs; a differential pair of transistors connected to said outputs of said differential amplifier, said differential pair of transistors configured to shift a cross over point of the signals carried at the outputs of said differential amplifier, further comprising a plurality of differential pairs of transistors connected to said outputs of said differential amplifier, wherein said circuit includes a differential circuit having inputs and outputs, wherein outputs of said differential pair of transistors are connected to inputs of said differential circuit, and said differential amplifier is connected to the outputs of said differential circuit.

8. A circuit as recited in claim 7, wherein said differential signals received at the pair of inputs comprises DC signals.

9. A circuit as recited in claim 7, wherein said differential pairs of transistors are configured to change a DC level of at least one of the inputs of said differential circuit in order to shift a cross over point of the inputs of the differential circuit and thereby effect a duty cycle change at the outputs of the differential circuit.

10. A circuit as recited in claim 9, wherein said differential signals received at the pair of inputs comprises DC signals.

11. A circuit configured to correct a duty cycle error of a clock signal, said circuit comprising: a pair of inputs configured to receive differential signals, wherein a difference between said differential signals generally indicates the duty cycle error of the clock signal; a differential amplifier connected to said inputs, said differential amplifier having outputs; at least one differential pair of transistors connected to said outputs of said differential amplifier, wherein said circuit includes a differential circuit having inputs and outputs, wherein outputs of said at least one differential pair of transistors are connected to inputs of said differential circuit, and said differential amplifier is connected to the outputs of said differential circuit, wherein said at least one differential pair of transistors is configured to change a DC level of at least one of the inputs of said differential circuit in order to shift a cross over point of the inputs of the differential circuit and thereby effect a duty cycle change at the outputs of the differential circuit.

12. A circuit configured to vary a duty cycle of a clock signal, said circuit comprising: a pair of inputs configured to receive differential signals; a control circuit connected to said inputs, said control circuit having outputs; a differential pair of transistors connected to said outputs of said control circuit, said differential pair of transistors configured to shift a cross over point of the signals carried at the outputs of said control circuit, further comprising a plurality of differential pairs of transistors connected to said outputs of said control circuit.

13. A circuit as recited in claim 12, wherein said differential signals received at the pair of inputs comprises DC signals.

14. A circuit configured to vary a duty cycle of a clock signal, said circuit comprising: a pair of inputs configured to receive differential signals; a control circuit connected to said inputs, said control circuit having outputs; a differential pair of transistors connected to said outputs of said control circuit, said differential pair of transistors configured to shift a cross over point of the signals carried at the outputs of said control circuit, wherein said circuit includes a differential circuit having inputs and outputs, wherein outputs of said differential pair of transistors are connected to inputs of said differential circuit, and said control circuit is connected to the outputs of said differential circuit.

15. A circuit as recited in claim 14, wherein said differential signals received at the pair of inputs comprises DC signals.

16. A circuit as recited in claim 14, wherein said differential pair of transistors is configured to change a DC level of at least one of the inputs of said differential circuit in order to shift a cross over point of the inputs of the differential circuit and thereby effect a duty cycle change at the outputs of the differential circuit.

17. A circuit as recited in claim 16, wherein said differential signals received at the pair of inputs comprises DC signals.

18. A circuit configured to vary a duty cycle of a clock signal, said circuit comprising: a pair of inputs configured to receive differential signals; a control circuit connected to said inputs, said control circuit having outputs; a differential pair of transistors connected to said outputs of said control circuit, said differential pair of transistors configured to shift a cross over point of the signals carried at the outputs of said control circuit, further comprising a plurality of differential pairs of transistors connected to said outputs of said control circuit, wherein said circuit includes a differential circuit having inputs and outputs, wherein outputs of said differential pair of transistors are connected to inputs of said differential circuit, and said control circuit is connected to the outputs of said differential circuit.

19. A circuit as recited in claim 18, wherein said differential pairs of transistors are configured to change a DC level of at least one of the inputs of said differential circuit in order to shift a cross over point of the inputs of the differential circuit and thereby effect a duty cycle change at the outputs of the differential circuit.

20. A circuit as recited in claim 19, wherein said differential signals received at the pair of inputs comprises DC signals.

21. A circuit as recited in claim 18, wherein said differential signals received at the pair of inputs comprises DC signals.

22. A circuit configured to vary a duty cycle error of a clock signal, said circuit comprising: a pair of inputs configured to receive differential signals; a control circuit connected to said inputs, said control circuit having outputs; at least one differential pair of transistors connected to said outputs of said control circuit, wherein said circuit includes a differential circuit having inputs and outputs, wherein outputs of said at least one differential pair of transistors are connected to inputs of said differential circuit, and said control circuit is connected to the outputs of said differential circuit, wherein said at least one differential pair of transistors is configured to change a DC level of at least one of the inputs of said differential circuit in order to shift a cross over point of the inputs of the differential circuit and thereby effect a duty cycle change at the outputs of the differential circuit.

23. A method of correcting a duty cycle error of a clock signal, said method comprising using a circuit to correct the duty cycle by providing differential signals to a pair of inputs of the circuit, wherein a difference between said differential signals generally indicates the duty cycle error of the clock signal, wherein the circuit includes a differential amplifier connected to the inputs, the differential amplifier has outputs, and a plurality of differential pair of transistors connected to the outputs of the differential amplifier, said method further comprising using the differential pairs of transistors to shift a cross over point of the signals carried at the outputs of the differential amplifier.

\* \* \* \* \*